United States Patent
Kamitani

[11] Patent Number: 6,028,762
[45] Date of Patent: *Feb. 22, 2000

[54] ELECTROSTATIC CHUCK

[75] Inventor: Satoru Kamitani, Kagoshima, Japan

[73] Assignee: Kyocera Corporation, Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/787,027

[22] Filed: Jan. 28, 1997

[30] Foreign Application Priority Data

Jan. 31, 1996 [JP] Japan .................................. 8-015469

[51] Int. Cl.$^7$ .................................................. H02N 13/00
[52] U.S. Cl. .......................................... 361/234; 279/128
[58] Field of Search .................................... 361/230, 233, 361/234; 279/128

[56] References Cited

U.S. PATENT DOCUMENTS

| | | | |
|---|---|---|---|
| 5,160,152 | 11/1992 | Toraguchi et al. | 361/234 |
| 5,413,360 | 5/1995 | Atari et al. | 361/234 |
| 5,426,558 | 6/1995 | Sherman | 361/234 |
| 5,452,177 | 9/1995 | Frutiger | 361/234 |
| 5,522,131 | 6/1996 | Steger | 361/234 |
| 5,530,616 | 6/1996 | Kitabayashi et al. | 361/234 |
| 5,535,090 | 7/1996 | Sherman | 361/234 |
| 5,548,470 | 8/1996 | Husain et al. | 361/234 |
| 5,583,736 | 12/1996 | Anderson et al. | 361/234 |
| 5,631,803 | 5/1997 | Cameron et al. | 361/234 |
| 5,761,023 | 6/1998 | Lue et al. | 361/234 |

OTHER PUBLICATIONS

GPI Web Client Abstract of Japan JP405267436A, to GOTO, Appl. JP 04064122, Oct. 1993.
GPI Web Client Abstract of Japan JP401251735A, to SEKINE, Appl. JP 63078975, Oct. 1989.

*Primary Examiner*—Fritz Fleming
*Attorney, Agent, or Firm*—Loeb & Loeb, LLP

[57] ABSTRACT

In an electrostatic chunck with grooves formed on the dielectric layer surface, the rate of foreign matter adhering to the semiconductor wafer is reduced and at the same time the semiconduticor wafer can be uniformly heated without causing leakage of lie or other gases supplied to the grooves of the said holding surface into the chamer. The electrostatic chuck is composed of a dielectric layer made from ceramics or sapphire which has electrostatic electrodes, holding surface positioned on a same plane and concave spaces positioned next to the holding surface, at least one of the said holding surface being circumference, and the outermost such holding surface having a width of 1–20 $\mu$m and being a smooth surface having a center line average roughness (Ra) of 0.3 $\mu$m or less.

2 Claims, 3 Drawing Sheets

ELECTROSTATIC CHUCK

BACKGROUND OF THE INVENTION

1. Field of the Invention

The present invention relates to an electrostatic chuck used to hold semiconductor wafers in the semiconductor manufacturing process.

2. Description of the Prior Art

Hitherto, for the film-forming equipment for affixing film to semiconductor wafers or the etching equipment for carrying out details on semiconductor wafers in manufacturing process of the semiconductor facilities, an electrostatic chuck is used for a jig to hold semiconductor wafers at high accuracy.

For this kind of electrostatic chuck there existed electrostatic chucks comprising an electrostatic electrode 28 embedded inside the ceramic base substrate 22 formed integral with a dielectric layer 23 consisting of ceramics such as alumina, silicon nitride, or aluminum nitride with high insulation capability and a ceramic substrate 24, wherein on the surface of the said dielectric layer 23, grooves 26 were engraved to achieve unevenness, and the top surface of the convex portion 27 was used for a holding surface 25 in order to reduce the area in contact with a semiconductor wafer 100 and to minimize adhesion of foreign matter to the semiconductor wafer 100. Because to form film or carry out etching, it is necessary to uniformly heat the semiconductor wafer 100, the said electrostatic chuck 21 was indirectly heated by a beater or a resistance heating element was embedded in the ceramic substrate 24 composing the electrostatic chuck 21 to directly generate heat.

At the center portion of the said ceramic base substrate 22, a through hole 29 was drilled, and by supplying He and other gas from the said through hole 29 to the groove 26 of the dielectric layer 23, the heat transfer coefficient was increased at the groove portion 26 and the semiconductor wafer 100 sucked and held to the holding surface 25 was designed to be uniformly heated.

However, film forming and etching are carried out under the vacuum condition normally at $1 \times 10^{-3}$ torr or lower, but when the semiconductor wafer 100 is electrostatically sucked to the holding surface 25 using the electrostatic chuck 21 as shown in FIG. 3 and He or other gas is supplied to the groove 26 of the holding surface 25, this gas flows out from the clearance between the semiconductor wafer 100 and the holding surface 25 to the inside of the chamber and the vacuum inside the chamber is lost, giving rise to a problem of detrimental effects on the accuracy of film-forming to the semiconductor wafer 100 or processing accuracy.

That is, the excessively small width of the outermost circumference of convex portion 27' in contact with the peripheral portion of the semiconductor wafer 100 generates chipping or cracking at the edge of the convex portion 27' when engraving grooves 26, and as a result even when the semiconductor wafer 100 is sucked and held to the holding surface 25, a clearance is formed between the semiconductor wafer 100 and the convex portion 27', ausing He or other gas to leak.

Even if any chipping or cracking is not generated at the edge of the convex portion 27', excessively rough profile irregularity of the top surface has a possibility to allow He or other gas to leak.

On the other hand, excessively large width of the outermost circumferential convex portion 27' in contact with the peripheral portion of the semiconductor wafer 100 excessively increases temperature difference between inner and outer wall surfaces of the convex portion 27', resulting in poor heat transfer coefficient in the peripheral portion of the semiconductor wafer 100 and impeding heat uniformity, and there is a possibility to cause detrimental effects on film forming accuracy and processing working accuracy.

In addition, the electrostatic chuck 21 shown in FIG. 3 is designed to reduce the area in contact with the semiconductor wafer 100 by engraving grooves 26 on the surface of the dielectric layer 23 in order to reduce the adhesion of foreign matter on the holding surface 25 to the semiconductor wafer 100 to minimum, but excessively shallow groove 26 attracts foreign matter on the bottom surface of the groove 26 to the semiconductor wafer 100 by electrostatic absorption force, giving rise to a problem in that the adhesion of foreign matter is unable to be sufficiently reduced.

SUMMARY OF THE INVENTION

Under these circumstances, in an electrostatic chuck comprising a dielectric layer made from ceramic sapphire which has electrostatic electrodes, holding surfaces positioned on a same plane and concave spaces positioned next to the holding surface, at least one of the said holding surfaces being circumference, and the outermost such holding surface having a width of 1–20 mm and being a smooth surface having a center line average roughness (Ra) of 0.3 μm or less. In this invention, the concave space having a depth of 5 μm or more.

EMBODIMENTS

Figure 1A:
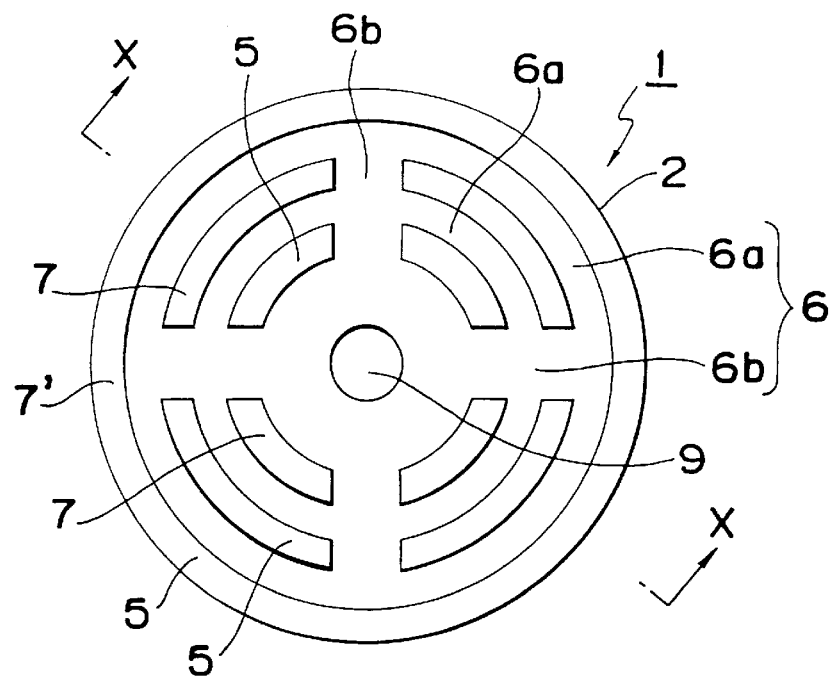
FIG. 1 shows one example of the electrostatic chuck 1 according to this invention, and (a) is a front elevation and (b) is a cross-sectional view taken on line X—X.
Figure 1B:
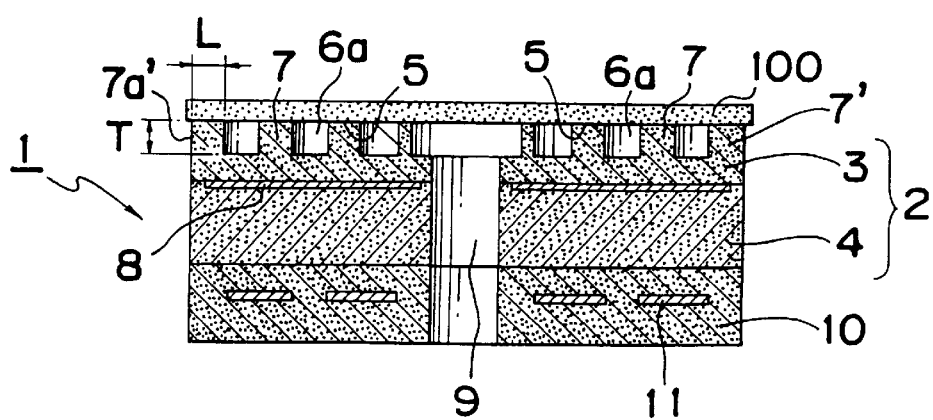

FIG. 1 shows one example of the electrostatic chuck 1 according to this invention, and (a) is a front elevation and (b) is a cross-sectional view taken on line X—X.

The electrostatic chuck 1 shown in FIG. 1 comprises a ceramic base substrate 2 in the form of a disk in the diameter nearly same as that of a semiconductor wafer 100, and the said ceramic base substance layer 2 comprises a dielectric layer 3, electrostatic electrode 8, and ceramic substrate 4, and the dielectric base layer 3 comprises at least ceramics such as alumina, aluminum nitride, silicon nitride, etc. with high insulation capability. The electrostatic electrode 8 is designed to be slightly smaller than the outside diameter of the ceramic substrate 2 in order to obtain uniform electrostatic suction force throughout the whole semiconductor wafer 100. The electrostatic chuck 1 shown in FIG. 1 is of a single pole type but it may be designed to be a bipolar type by splitting the electrostatic electrode 8 into a plurality of electrodes, energizing each one of them to generate electrostatic suction force.

On the surface of the dielectric layer 3 of the said ceramic base substrate 2, a plurality of concentric grooves 6a and a plurality of grooves 6b extending radially from the center are engraved, respectively, to provide irregular surfaces, the top surface of the said convex portion 7 is designated as a holding surface 5, and at the same time, a through hole 9 is drilled through to the rear surface of the ceramic base substrate 2 at the center portion of the electrostatic chuck 1, so that He and other gases can be supplied to the groove 6 of the dielectric layer 3 from the relevant through hole 9.

On the rear surface of the electrostatic chuck 1, a ceramic heater 10 with a resistance heating element 11 embedded is securely fixed so that it can indirectly heat the electrostatic chuck 1 to heat the semiconductor wafer 100.

Because loading the semiconductor wafer 100 on the holding surface 5 of this electrostatic chuck 1 and applying voltage across the said wafer 100 and the electrostatic electrode 8 generates electrostatic absorption forces between the wafer 100 and the dielectric layer 3 such as Coulomb's force by dielectric polarization and Johnson-Rabbek force by traces of leak current, the semiconductor wafer 100 can be held onto the holding surface 5 by the sufficient absorbing force. In addition, because on the holding surface 5, grooves 6 are engraved to reduce the area in contact with the semiconductor wafer 100. it is possible to reduce the amount of foreign matter adhering to the semiconductor wafer 100 on the holding surface 5 and at the same time it is possible to generate heat in the ceramic heater 10 to heat the electrostatic chuck 1 and to increase the heat transfer coefficient in the groove 6 portion, and it is possible to uniformly heat the semiconductor wafer 100 by supplying He and other gases to the grooves 6 of the dielectric layer 3 via the through hole 9. The convex portion 7' on the outermost circumference is formed in such a manner to isolate the said groove 6 from the chamber to prevent He and other gases supplied to the grooves 6 of the holding surface 5 from leaking into the chamber when the semiconductor wafer 100 is sucked and held on the holding surface 5.

Now, in the electrostatic chuck 1 with the surface of the dielectric layer 3 made in the irregular form as shown in FIG. 1, the width L of at least the convex portion 7' on the outermost circumference becomes important of the convex portions 7 constituting the holding surface 5.

That is, if the width L of the convex portion 7' on the outermost circumference is less than 1 mm, chipping or cracking is likely to occur in the edge of the convex portion 7' in engraving grooves 6, and because a clearance is formed between the groove and the semiconductor wafer 100 when chipping or cracking is generated, gas such as He, etc. supplied to the groove 6 leaks from this clearance to the inside of the chamber of the film forming equipment or etching equipment, vacuum inside the chamber is lost, causing detrimental effects on the film forming accuracy and processing accuracy. However, because the outer wall surface 7' a of the said convex portion 7' on the outermost circumference is not in contact with gas such as He, etc., if the width L of the convex portion 7' is greater than 20 mm, temperature difference between inner and outer wall surfaces at the convex portion 7' becomes excessively large, and heat uniformity at the peripheral portion of the semiconductor wafer 100 is impeded, it is impossible to coat the film with uniform thickness when film is provided on the semiconductor wafer 100, causing inconvenience in that the semiconductor wafer 100 is unable to be processed to a specified size when details are processed on the semiconductor wafer 100.

Consequently, it is important to keep the width L of at least the convex portion 7' on the outermost circumference of the convex portions 7 constituting the holding surface 5 to be 1–20 mm.

It is also important to keep the top surface of at least the convex portion 7' on the outermost circumference to be 0.3 μm or less in terms of center line average roughness (Ra) as in the case of specifying the width L of the convex portion 7' on the outermost circumference.

That is, when the top surface of the convex portion 7' on the outermost circumference is greater than 0.3 μm in terms of center line average roughness (Ra), even if the semiconductor wafer 100 is electrostatically sucked, a fine clearance is formed between the groove and the semiconductor wafer 100 due to excessively coarse top surface of the convex portion 7' and from this clearance, He and other gases leak.

In addition, the depth T of the groove 6 engraved on the surface of the dielectric layer 3 must be 5 μm or larger. This is because it is unable to sufficiently reduce the adhesion rate of the foreign matter to the semiconductor wafer 100 since the foreign matter on the groove 6 bottom surface is not directly in contact with the semiconductor wafer 100 but is attracted to the semiconductor wafer 100 by the electrostatic suction force if the depth T of the groove 6 is less than 5 μm.

By the way, this invention is able to be applied to electrostatic chucks 1 with various groove 6 patterns.

Figure 2A:
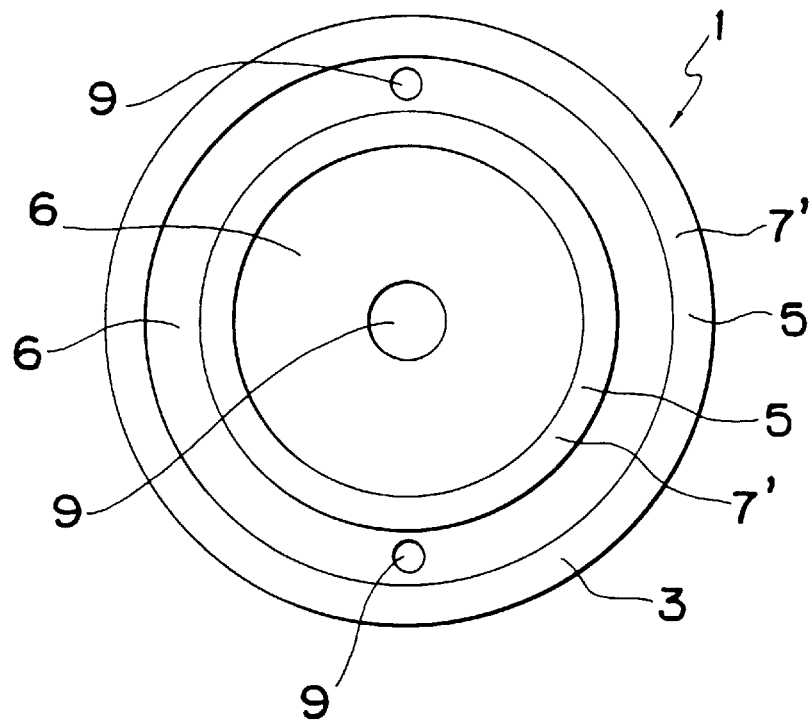
FIG. 2 (a) and (b) are front elevation showing other example of the electrostatic chuck according to this invention.
Figure 2B:
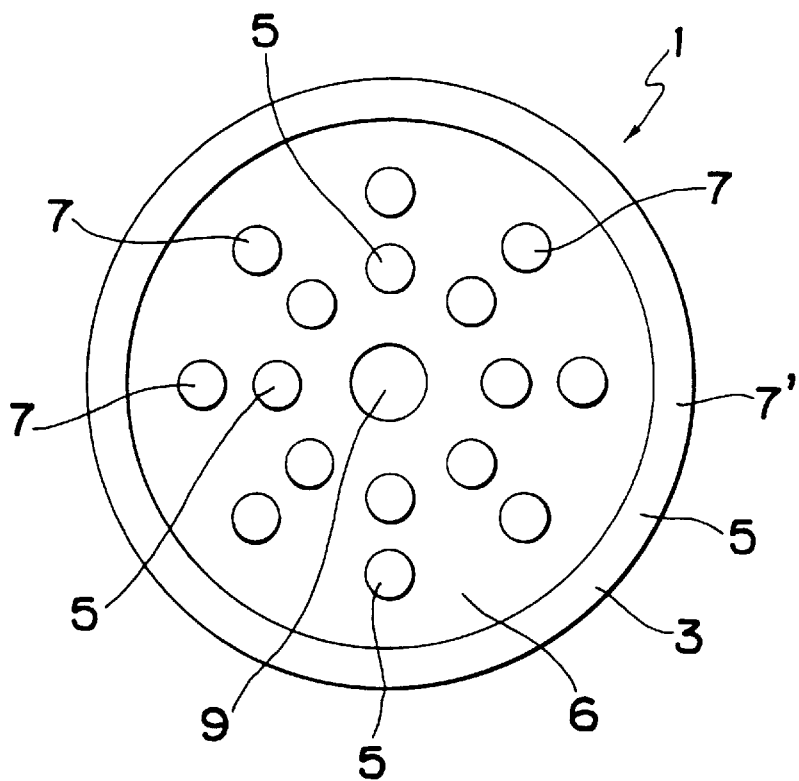
Figure 3:
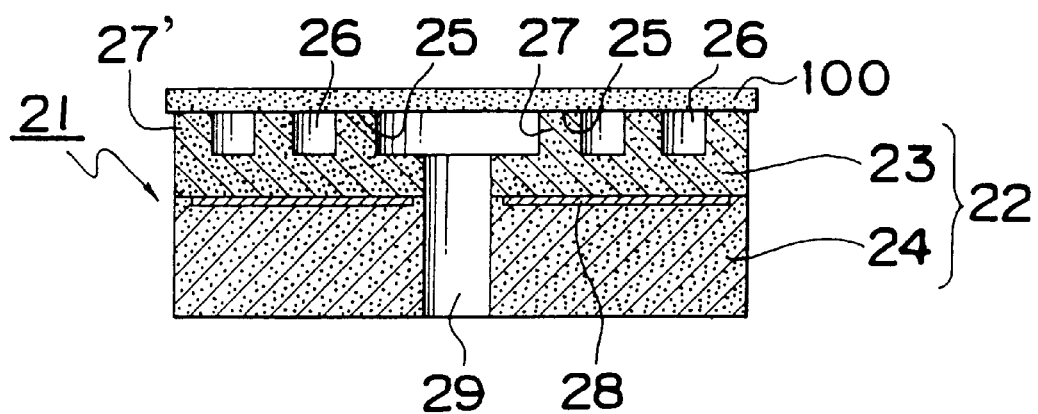
FIG. 3 is a cross-sectional view showing a conventional electrostatic chuck.

For example, the electrostatic chuck 1 shown in FIG. 2 (*a*) is designed to have an irregular surface with concentrical grooves 6 engraved on the surface of the dielectric layer 3 and to bring each convex portion 7' in the form of a ring in contact with the peripheral portion of semiconductor wafer 100 of varying sizes. The width L of each convex portion 7' in the form of a ring is designed to be 1–20 mm, and their top surface is made to have a smooth surface of 0.3 μm or less in terms of center line average roughness (Ra) and at the same time, on each groove 6, a through hole 9 is drilled to independently feed He and other gases.

The electrostatic chuck 1 with these grooves 6engraved is economical because it is possible to suck and hold semiconductor wafers 100 with varying sizes only by one electrostatic chuck 1.

The electrostatic chuck 1 shown in FIG. 2 (*b*) is designed to have a large number of fine protrusions 7 planted on the surface of the dielectric layer 3 and at the same time a ring-form convex portion 7' provided on the outermost circumferential portion, with a groove 6 engraved on the remaining portion. The width L of the convex portion 7' in the form of a ring on the outermost circumferential portion is designed to be 1–20 mm and their top surface is made to have a smooth surface of 0.3 μm or less in terms of center line average roughness (Ra). At the center of the dielectric layer 3, a through hole 9 is drilled to feed He and other gases to the said groove 6.

With the electrostatic chuck 1 provided with this kind of groove 6, it possible to further reduce the surface in contact with the semiconductor wafer 100 and it is therefore possible to further reduce the adhesion rate of foreign matter to the semiconductor wafer 100.

The electrostatic chuck 1 according to this invention shall not be limited to the electrostatic chuck 1 with the groove 6described above but may be such in that at least the width L of the convex portion 7' on the outermost circumference of the convex portion 7 at least comprising the holding surface 3 is designed to be 1–20 mm and the top surface of it should be designed to be 0.3 μm or less in terms of center line average roughness (Ra), and in addition, it is more preferable to have the depth T of the groove 6 of the holding surface 5 to be 5 μm.

Embodiment (Embodiment 1)

Now, an electrostatic chuck 1 made of aluminum nitride with a groove 6 shown in FIG. 1 was trially made and experiments were carried out to check for any sign of leakage when He gas was supplied to the groove 6 with a semiconductor wafer 100 sucked and held.

For the electrostatic chuck 1 used for the experiment, a slurry was prepared by adding a binder as a solvent to the pulverized high-purity aluminum nitride, then, a plurality of green sheets were formed by a tape forming method such as the doctor blade method, and to one of these green sheets, a tungsten paste with pulverized aluminum nitride added was printed by the screen printing process, then, the remaining green sheets were laminated in such a manner to cover the said tungsten paste and heat-pressurized at 50° C. and at pressure of about 30 kg/cm² to form a laminate, and the laminate was formed into a disk by machining. Then, the disk-form laminate was vacuum-degreased and then reduction-fired at about 2000° C., and an aluminum-nitride ceramic substrate 2 with an electrostatic electrode 8 provided between the dielectric layer 3 and the ceramic base substrate 4 was obtained.

To the center of this ceramic substrate 2, a through hole 9 about 10 mm in diameter was drilled and at the same time, the surface of the dielectric layer 3 was machined to engrave a plurality of concentric grooves 6a and a plurality of grooves 6b radially extending from the center in order to have the irregular surface, and then, the top surface of the said convex portion 7 was polished to form a holding surface 5. And an aluminum nitride electrostatic chuck 1 was there by obtained.

Now, electrostatic chucks 1 with the width L of the convex portion 7' on the outermost circumference made to be 0.5 mm, 1.0 mm, 10.0 mm, 20.0 mm, and 30.0 mm were prepared and placed in a chamber of a film forming machine, and 1000-V voltage was applied across the semiconductor wafer 100 placed on the holding surface 5 of the electrostatic chuck 1 and the electrostatic electrode 8 in order to suck and hold the semiconductor wafer 100, and then, the vacuum of the chamber was measured to determine any sign of He gas leakage when He gas was supplied to the groove 6 of the electrostatic chuck 1 from the through hole 9.

The holding surface 5 containing the convex portion 7' on the outermost circumference was designed to be 0.3 μm or less in terms of center line average roughness (Ra) and at the same time the chamber was held first to vacuum of $1.0 \times 10^{-5}$ torr or lower to carry out measurements.

Table 1 shows the results, respectively.

TABLE 1

|  | Width L at convex portion 7' (mm) | Vacuum inside the chamber (torr) |
| --- | --- | --- |
| ‡ | 0.5 | 66 |
| Present invention | 1.0 | $1.0 \times 10^{-5}$ or lower |
|  | 10.0 | $1.0 \times 10^{-5}$ or lower |
|  | 20.0 | $1.0 \times 10^{-5}$ or lower |
|  | 30.0 | $1.0 \times 10^{-5}$ or lower |

‡ Outside the scope of present invention

The results indicated that when the width L of the convex portion 7' on the outermost circumference was equal to an greater than 1.0 mm, no leakage of He gas was observed and the initial vacuum condition was able to be held, but when the width L of the convex portion 7' on the outermost circumference was 0.5 mm, vacuum of the chamber was greatly lowered to 66 torr and leakage of He gas was observed. Therefore, observation was made on the convex portion 7' with the width L to be 0.5 mm and it was found that cracking and chipping were generated at the edge portion.

This indicates that the width L of the convex portion 7' on the outermost circumference should be in the range of 1.0 mm or more. In addition, using electrostatic chucks 1 with the width L of the convex portion 7' on the outermost circumference to be 1.0 mm 10.0 mm 20.0 mm, and 30.0 mm, the film distribution was measured when film was formed on the semiconductor wafer 100 sucked and held on the holding surface 5. In this experiment, it was accepted that the film thickness distribution required in manufacturing semiconductor equipment was 10% or less.

TABLE 2

|  | Width L of convex portion 7' (mm) | Film distribution of semi-conductor wafer (%) |
| --- | --- | --- |
| Present invention | 1.0 | 5 |
|  | 10.0 | 8 |
|  | 20.0 | 10 |
| ‡ | 30.0 | 12–20 |

‡ Outside the scope of this invention

The results indicate that the accuracy of film thickness distribution can be improved by reducing the width L of the convex 7' on the outermost circumference. It was able to suppress the film thickness distribution to 10% or less when the width L of the convex portion 7' on the outermost circumference was less than 20.0 mm, but it was unable to suppress the film thickness distribution to 10 or less when the width L of the convex portion 7' was 30.0 mm, where the film thickness distribution ranged 12–20%. Therefore, when observation was made on semiconductor wafers 100 on which the film was formed by using relevant electrostatic chucks 1, it was found that the film thickness accuracy in the peripheral portion of the wafer 100 corresponding to the convex portion 7' on the outer most circumference had great influences on the film thickness distribution, and when the width L of the convex portion 7' on the outermost circumference became 20.0 mm or larger, the heat uniformity of the wafer 100 was impeded and the film thickness distribution was affected.

The above results indicate that the width L of the convex portion 7' on the outermost circumference should be held to 1–20 mm.

(Embodiment 2)

Then, electrostatic chucks 1 with the top surface of the convex portion 7' on the outermost circumference made to 0.1, 0.2, 0.3, and 0.4 μm in terms of center line average roughneee (Ra) were prepared and measurements were carried out to check for any sign of leakage of He gas in the same manner as in the case of Embodiment 1.

Measurements were carried out with the width L of the convex portion 7' on the outer most circumference to be 1 mm and at the same time the chamber inside held to vacuum of $1.0 \times 10^{-5}$ torr or lower.

TABLE 3

|  | Center line average height of the top surface of convex portion 7' (μm) | Vacuum inside the chamber (torr) |
| --- | --- | --- |
| Prevent invention | 0.1 | $1.0 \times 10^{-5}$ or lower |
|  | 0.2 | $1.0 \times 10^{-5}$ or lower |
|  | 0.3 | $1.0 \times 10^{-5}$ or lower |
| ‡ | 0.4 | 100 |

‡ Outside the scope of this invention

The results indicate that no leakage of He gas was observed with the case in which the center line average roughness (Ra) of the top surface of the convex portion 7' was 0.3 μm or less, and the initial vacuum condition was able to be held, but with the center line average roughness (Ra) of the top surface of the convex portion 7' was 0.4 μm, the vacuum inside the chamber lowered to 100 torr and leakage of He gas was observed.

This indicates that the center line average roughness (Ra) of the top surface of the convex portion 7' should be 0.3 μm or less.

(Embodiment 3)

In addition, electrostatic chucks 1 with the groove 6 depth T of the dielectric layer 3 made to be 3, 5, 10 and 30 μm were prepared, and the semiconductor wafer 100 was sucked and held, and then the rate of foreign matter adhering to the semiconductor wafer 100 was measured with a particle counter.

In this experiment, the electrostatic chucks in which the rate of foreign mater adhering to the semiconductor wafer was 250 or less were accepted because it is the number of particles required in manufacturing the semiconductor equipment.

Table 4 shows the results, respectively.

TABLE 4

| Prevent invention | Groove depth T of convex portion (μm) | Number of particles of semiconductor wafer (pcs.) |
|---|---|---|
| ‡ | 3 | Approx. 500 |
| Present invention | 5 | Approx. 200 |
|  | 10 | Approx. 200 |
|  | 30 | Approx. 200 |

‡ Outside the scope of this invention

The results indicate that it was able to suppress the number of particles of foreign matter adhering to the wafer 100 to about 200 pcs, because sufficient distance was provided to the wafer 100 when the groove 6 depth T was 5 μm or more. In contrast, with electrostatic chucks with the groove 6 depth T of 3 μm, foreign matter on the groove 6 bottom surface was attracted by electrostatic suction force due to the short distance to the wafer 100 and it was unable to suppress the number of particles of foreign matter adhering to the semiconductor wafer 100 to 250 pcs, or less.

This indicates that the depth T of the groove 6 should be 5 μm or more.

As described above, this invention can not only such and hole the semiconductor wafer on the holding surface highly accurately by designing the width of at least the convex portion on the outermost circumference to be 1–20 mm of the convex portions composing the holding surface and by designing the top surface of it to be a smooth surface of 0.3 μm or less in terms of center line average roughness (Ra) in the electrostatic chuck comprising an electrostatic electrode on one surface of the dielectric layer made from either ceramics or sapphire, grooves on the other surface to have irregular surfaces, and the top surfaces of the said convex portions used for the holding surfaces, but also can reduce the rate of foreign matter adhering to the semiconductor wafer. In addition, by supplying He or other gases to the groove on the holding surface, it is possible to uniformly heat the semiconductor wafer and at the same time it does not generate gas leakage, and, therefore, the vacuum inside the chamber of the film forming equipment or etching machine is not lowered. Consequently, if the film is formed on the semiconductor wafer using the electrostatic chuck according to this invention,it is possible to form film at high accuracy, and if details are provided to the semiconductor wafer, the patterns can be processed at high accuracy to specified sizes.

Because in this invention, foreign matter on the bottom of the groove can be prevented from being attracted to the semiconductor wafer by designing the depth of the groove provided on the said holding surface to be 5 μm or more, the rate of foreign matter adhering to the semiconductor wafer can be greatly reduced. In addition, it is possible to uniformly heat the semiconductor wafer by supplying He or other gases to the groove on the holding surface and at the same time, gas leakage is not generated, and therefore, the vacuum inside the chamber of the film forming equipment or etching machine is not lowered. Consequently, it is possible to form film at high accuracy if film is formed on the semiconduct or wafer using the electrostatic chuck according to this invention, and if details are processed on the semiconductor wafer, the patterns can be processed at high accuracy to specified sizes.

In this invention, it is possible to prevent foreign matter in the bottom of the groove from being attracted to the semiconductor wafer by electrostatic suction force by designing the depth of the groove provided on the said holding surface to be 5 μm or more, the rate of foreign matter adhering to the semiconductor wafer can be greatly reduced.

What is claimed is:

1. In an electrostatic chuck comprising a rigid dielectric layer made from ceramics or sapphire which has electrostatic electrodes, holding surfaces positioned on a same plane, and at least two grooves adjacent the holding surfaces and having bottom surfaces spaced below plane;

at least two of the holding surfaces being separated by one of the at least two grooves and being formed of concentric rings and adapted to receive generally circular semiconductor wafers of different diameters so that one of the rings is in contact with a semiconductor wafer around a peripheral portion of the wafer adjacent an outer edge thereof when mounted thereon, and each of the rings having a width of 10–20 mm and being a smooth surface having a center line average roughness (Ra) of 0.3 μm or less; and the bottom surfaces of the grooves being spaced at least 5 μm below the plane to minimize an amount of foreign-particle adhesion from the bottom surface of the grooves to a semiconductor wafer on the holding surface by electrostatic forces.

2. In an electrostatic chuck comprising a rigid dielectric layer made from ceramics or sapphire that has electrostatic electrodes, holding surfaces positioned on a same plane, and at least two grooves adjacent the holding surfaces and having bottom surfaces spaced below the plane;

at least two of the holding surfaces being separated by one of the at least two grooves and being formed of concentric rings and adapted to receive generally circular semiconductor wafers of different diameters so that one of the rings is in contact with a semiconductor wafer around a peripheral portion of the wafer adjacent an outer edge thereof when mounted thereon, and each of the rings having a width of 10–20 mm and being a smooth surface having a center line average roughness (Ra) of 0.3 μm or less;

the bottom surfaces of the grooves being spaced at least 5 μm below the plane to minimize an amount of foreign-particle adhesion from the bottom surface of the grooves to a semiconductor wafer on the holding surface by electrostatic forces;

a source of gas; and each of the grooves having a through hole for independently feeding gas from the source to the groove.

* * * * *